United States Patent [19]
Benson

[11] Patent Number: 5,051,916
[45] Date of Patent: Sep. 24, 1991

[54] STIMULUS SIGNAL GENERATION METHOD TO MAXIMIZE DYNAMIC RANGE IN FREQUENCY RESPONSE FUNCTION CALCULATIONS

[75] Inventor: Richard A. Benson, Saratoga, Calif.

[73] Assignee: Tektronix, Inc., Beaverton, Oreg.

[21] Appl. No.: 464,486

[22] Filed: Jan. 12, 1990

[51] Int. Cl.$^5$ ............................................. G06F 15/20
[52] U.S. Cl. ..................................... 364/484; 364/553
[58] Field of Search ............... 364/553, 576, 484, 485, 364/486, 487, 726; 371/25.1

[56] References Cited

U.S. PATENT DOCUMENTS

| | | | |
|---|---|---|---|
| 3,710,082 | 1/1973 | Sloane et al. | 364/508 |
| 3,848,115 | 11/1974 | Sloane et al. | 364/508 |
| 4,061,017 | 12/1977 | Sloane et al. | 364/512 |
| 4,093,988 | 6/1978 | Scott | 364/484 |
| 4,703,433 | 10/1987 | Sharrit | 364/485 |
| 4,713,782 | 12/1987 | Blackham | 364/726 |
| 4,885,708 | 12/1989 | Yamaguchi et al. | 364/553 |

FOREIGN PATENT DOCUMENTS 1049920  10/1983  U.S.S.R. ............................... 364/576

OTHER PUBLICATIONS

*Introduction to Communication Systems*, by Ferrel G. Stremler, New York, Addison-Wesley Publishing Company, 1982.

*Digital Signal Analysis*, by Roth et al., Brüel & Kyaer, Jan. 1985.

Primary Examiner—Parshotam S. Lall
Assistant Examiner—Gary D. Yacura
Attorney, Agent, or Firm—Boulden G. Griffith

[57] ABSTRACT

A method for generating a stimulus signal for conducting frequency response function calculations maximizes the overall dynamic range of the calculations possible by balancing the requirements for dynamic range between the input channels of a Fourier analyzer used for monitoring the input and output of the system under analysis. A preferred version of the method includes the steps of estimating the frequency response function of the system under analysis, inverting the estimated frequency response function, taking the square root of the inverted estimated frequency response function, randomizing the phase of the inverse square-root estimated frequency response function, converting the phase-randomized inverse square-root estimated frequency response function to a time domain test signal, scaling the time domain test signal as necessary to produce the stimulus signal for conducting frequency response function calculations. If more accuracy is required, the method can be repeated using the results of one calculation as the estimated frequency response function input to the next calculation iteration. As the method is repeated and increasingly accurate results are obtained, the cross power spectrum taken between the stimulus signal and the output signal ideally becomes very flat within a few iterations, although practical considerations may place a limit on how completely this occurs.

19 Claims, 2 Drawing Sheets

STIMULUS SIGNAL GENERATION METHOD TO MAXIMIZE DYNAMIC RANGE IN FREQUENCY RESPONSE FUNCTION CALCULATIONS

BACKGROUND OF THE INVENTION

This invention relates to the field of frequency response function calculation, and more particularly to the field of stimulus signal generation for frequency response function calculations with maximum dynamic range.

A frequency response function describes the relationship between the input and output of a physical system. The system involved can be either mechanical, electrical, or some other type of linear physical system. To characterize such systems, it desirable to be able to accurately calculate their frequency response function, which in most cases is a very close approximation of the actual transfer function of the system.

The frequency response function is complex, since for each frequency component of the input to the system, there is both a magnitude value and phase value to the system's response.

A function, x(t), describes the magnitude of the stimulus signal to the system as a function of time. The Fourier transform function, X(f), of the stimulus signal, x(t), describes the magnitude and phase content of the stimulus signal as a function of frequency. Similarly, another function, y(t), describes the magnitude of the output from the system as a function of time. And, there is a related Fourier transform function, Y(f), that describes the magnitude and phase of the output signal, y(t), as a function of frequency.

$$X(f) = \text{Fourier Transform of } x(t) \quad (1)$$

$$Y(f) = \text{Fourier Transform of } y(t) \quad (2)$$

If the stimulus and output functions of a system, x(t) and y(t), are measured, the corresponding Fourier Transforms, X(f) and Y(f), can be calculated using a Fast Fourier Transform (FFT) algorithm or other similar method. Then, the frequency response function, $\hat{H}(f)$, can be calculated according to the following relationship:

$$\hat{H}(f) = \frac{Cspec(Y,X)}{Aspec(X)} \quad (3)$$

where, Cspec(X,Y) is the cross power spectrum between X(f) and Y(f), Aspec(X) is the auto power spectrum of Y(f), and $\hat{H}(f)$ is the frequency response function of the system, which in most cases is a good estimation of the actual transfer function of the system, H(f).

Modern instruments, such as the 2642 Personal Fourier Analyzer made by Tektronix, Inc., Beaverton, Oreg., provide a means for supplying stimulus to a system and measuring its response. The computational facilities and other capabilities of this instrument are described in the 2641/2642 Fourier Analyzer User's Guide and the 2641/2642 Fourier Analyzer TurboPac Application Library, both of which are hereby incorporated by reference.

Among the relevant capabilities and computational facilities available in the 2642 Personal Fourier Analyzer are the ability to perform the Fast Fourier Transform (FFT), the Inverse Fourier Transform (IFT), and the ability to calculate the frequency response function, $\hat{H}(f)$, between two signals on its inputs. The latter computation necessarily entails performing the cross power spectrum (Cspec) between the stimulus and output channels and the auto power spectrum (Aspec) on the stimulus channel.

Despite the automation of all of these computational facilities in this instrument, there are limitations to the calculations that can be made that arise from its inherent limitations. Specifically, there is a limit to the dynamic range of the frequency characteristics that can be accurately measured by each input channel. The dynamic range of a channel refers to the overall ability of the instrument to distinguish between real signals and those artifacts and distortions that inevitably occur during measurement and computation These include such factors as the non-linearity of analog components and A/D converters, signal leakage through power supplies and logic signals, jitter in the sampling clock, aliasing products, and truncation and other errors in the arithmetic associated with digital filtering, FFT computations, and averaging operations.

The dynamic range specification for the 2642 Personal Fourier Analyzer is 75 dB. This means that if a known-to-be-pure full-scale sine wave is applied to one of the inputs of the Analyzer, all of the associated spectral artifacts will be below the full scale by at least 75 dB. But, no matter how good the dynamic range of the input channels may be, there is still always some such limit.

One of the original methods of characterizing the frequency response function of a system under analysis, one that does not require powerful FFT analyzers, is to provide a pure sinusoidal signal at one frequency at the input, and then to measure the output of the system at that frequency at the output. By slowly varying the frequency, and measuring the system output at each frequency, the system can eventually be characterized for all frequencies of interest. This approach requires a lot of time, but does not require a lot of dynamic range on the input and output channels, since the settings of the input and output channels can be varied from frequency to frequency as the sweeping of the bandwidth of interest occurs.

Another approach, one that is preferred by many because it characterizes the whole bandwidth of interest very rapidly, is to apply broadband noise with a flat power spectrum, i.e., white noise, such that the Aspec of X(f) approaches a constant, to the system under analysis over the bandwidth of interest. The spectrum measured at the output of the system is then a close approximation of the system's estimated frequency response function, $\hat{H}(f)$, directly.

A variation on the foregoing method is too anticipate, by estimation or rough prior calculation, the system response and provide a signal source that is the inverse of the estimated frequency response function, $1/\hat{H}(f)$. The system output function, Y(f), will then be approximately a constant. But, to the extent that it is not a constant, the standard calculation of the transfer function can proceed, per equation (3) above, and the results can be used to refine the input function estimate and the process repeated.

From the point of view of the dynamic range limitations of the Fourier analyzer being used to make these measurements, both of these approaches suffer from the same major limitation. In each case, one channel, either the input channel or the output channel, has to supply most of the dynamic range required to make the measurement. If the input power spectrum is flat, the full variation of the frequency response function appears in the output spectrum, while if the output power spectrum is made flat the full range of the inverted frequency response function appears in the input spectrum.

What is desired is a method for generating a stimulus signal for conducting frequency response function calculations that maximizes the overall dynamic range of the calculations possible by balancing the requirements for dynamic range between the two analyzer channels being used to make the calculation.

SUMMARY OF THE INVENTION

Accordingly, the present invention is a method for generating a stimulus signal for conducting frequency response and other similar stimulus response function calculations that maximize-s the overall dynamic range of the calculations possible by balancing the requirements for dynamic range between the analyzer channels monitoring the input and output of the system under analysis.

This method includes the steps of estimating the frequency response function of the system under analysis, inverting the estimated frequency response function, taking the square root of the inverted estimated frequency response function, randomizing the phase of the inverse square-root estimated frequency response function, converting the phase-randomized inverse square-root estimated frequency response function to a time domain test signal, scaling the time domain test signal as necessary to produce a stimulus signal for conducting frequency response function calculations that allocates the requirement for amplitude dynamic range between the two signal analyzers channels used to monitor the stimulus signal and the output signal of the system under analysis.

If more accuracy is required, the method can be repeated using the improved estimate of the frequency response function from one calculation as the starting point for the next iteration. A the method is repeated and increasingly accurate results are obtained, the cross power spectrum taken between the stimulus signal and the output signal will ideally converge toward a flat profile within a few iterations.

DETAILED DESCRIPTION

Figure 1:
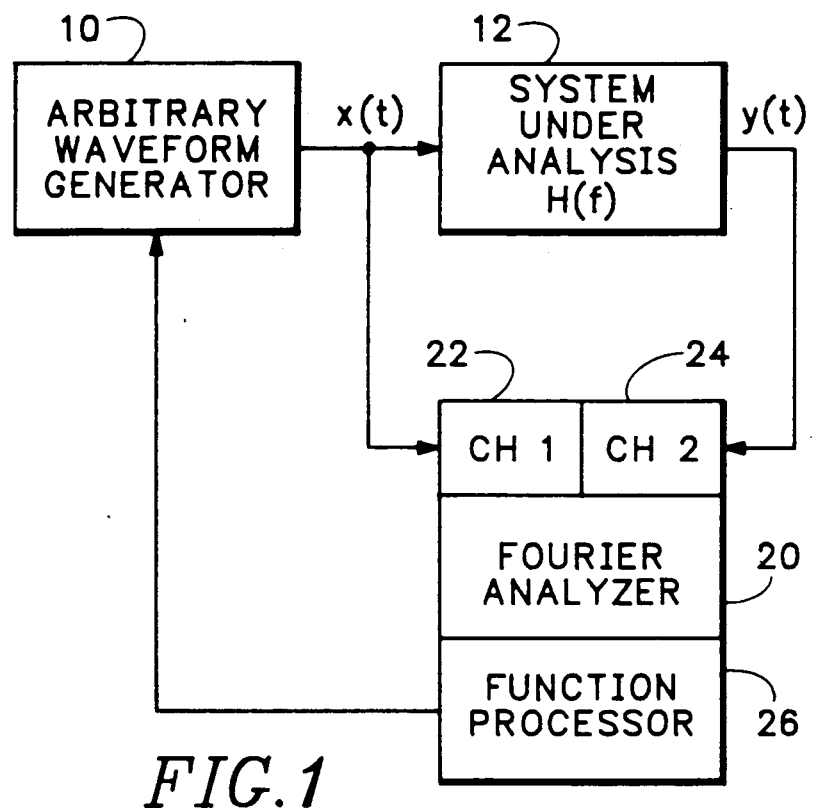
FIG. 1 is a block diagram of the test setup used to practice the present invention.

Referring to FIG. 1, an arbitrary waveform generator 10 produces a time-varying stimulus signal, x(t), having a frequency domain representation X(f). This stimulus signal, x(t), is applied to the input of system under analysis 12 having a frequency response function H(f). As a result of this stimulus, system under analysis 12 produces a time-varying output signal, y(t).

A Fourier analyzer 20 has an input channel 22 connected to monitor the stimulus signal x(t) and another input channel 24 connected to monitor the output signal y(t). A function processor 26 can perform a variety of functions on the signals monitored by the Fourier analyzer 20, either individually or between channels. The functions that the function processor can perform include FFT, IFT, and, between channels, frequency response functions, ^H(f).

Figure 2:
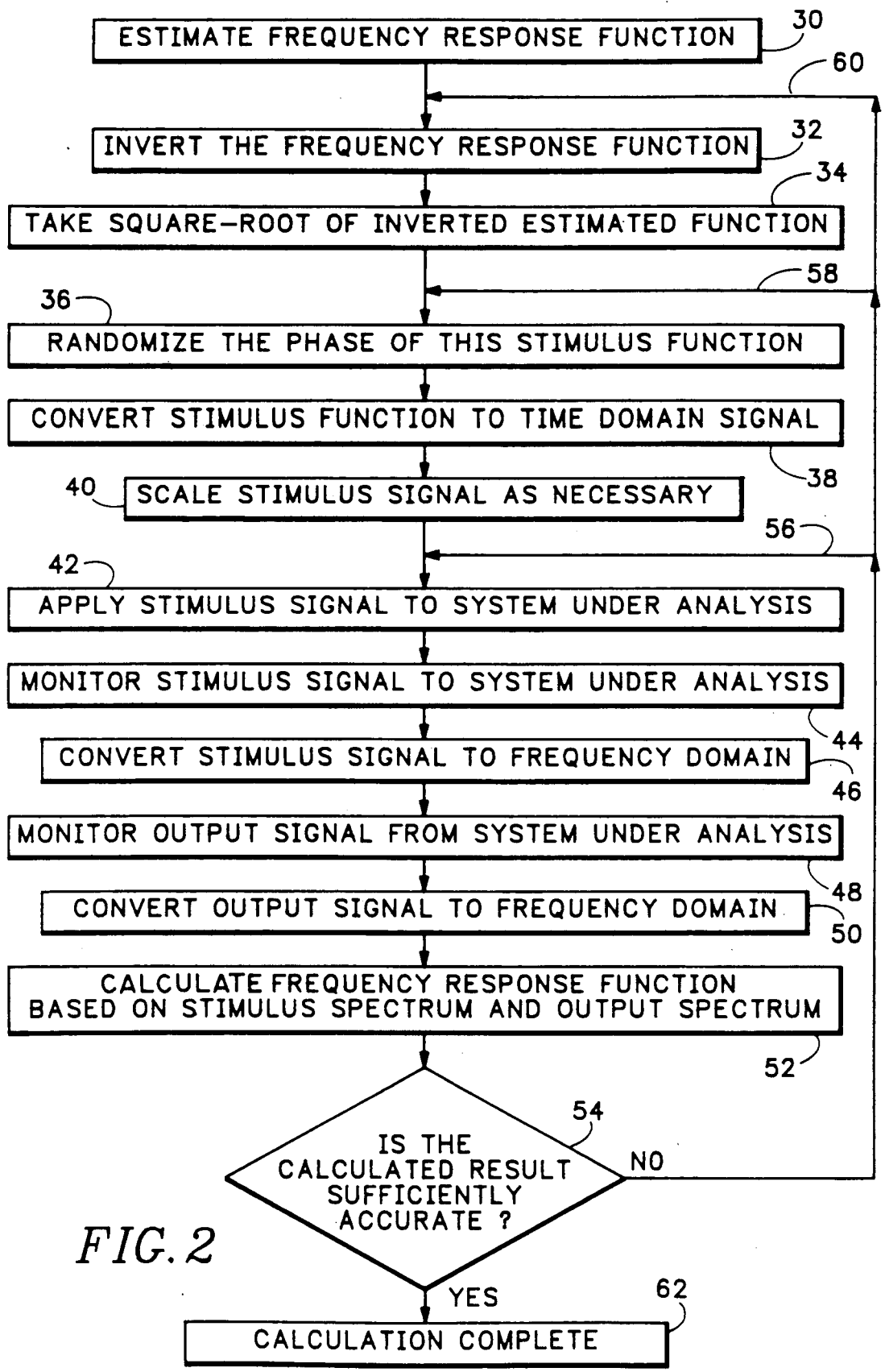
FIG. 2 is a logic flow diagram of the procedure used to practice the present invention.

Referring to FIG. 2, the procedure used to effect the present invention begins with an estimate of the frequency response function 30. This first estimate can easily be produced by applying broadband noise with a flat power spectrum, i.e., white noise, such that the Aspec of X(f) equals a constant, to the system under analysis over the bandwidth of interest and then converting the output signal to the frequency domain, as described above.

The estimated function is then inverted 32 and its square-root is taken 34. Inversion of frequency domain functions and taking their square roots are both facilities available in the 2642 Personal Fourier Analyzer. Preferably, the phase of the square-root inverse estimated frequency response function is next randomized. Randomizing the phase 36 is optional, but preferred because it leads to a time domain stimulus signal that has its total energy more evenly distributed over a longer time, and is therefore more conserving of the available dynamic range of the channel 22 used to monitor the stimulus signal. Phase randomization is another facility offered by 2642 Personal Fourier Analyzer.

The randomized square-root inverse estimated frequency response function X(f) is then converted to the corresponding time domain stimulus signal x(t) by an inverse Fourier transform (IFT) 38. Optionally, but preferably, this stimulus signal is then scaled as appropriate 40. It is desirable to do this scaling, since using a stimulus signal with the maximum available amplitude conserves the dynamic range of the channel 24 being used to monitor the output. This scaled time domain version of the randomized square-root of the inverse of the estimated frequency transfer function is then the stimulus signal, x(t), that is applied 42 to the system under analysis 12.

The Fourier analyzer 20 monitors the stimulus signal x(t) 44 received on channel one 22. This monitored time domain stimulus signal is converted to the frequency domain 46 to produce X(f) using an FFT process. The analyzer also monitors the system output signal y(t) 48 received on channel two 24 and performs an FFT operation on it to convert it to the frequency domain 50 producing Y(f). Alternatively, the randomized square-root inverse estimated frequency response function produced in step 40 could be used directly as X(f). The function processor 26 then calculates the cross power spectrum Cspec between these two functions, X(f) and Y(f). The function processor 26 also calculates the auto power spectrum, Aspec, on the stimulus function, X(f). Using these, the function processor 26 is then able to calculate 52 the frequency response function of the system under test according to equation (3) above.

If the result is sufficiently accurate 54, the calculation is complete 62. Whether or not the result is sufficiently accurate 54 can be determined by calculating how closely the Cspec (cross power spectrum) of X(f) and Y(f) approximates a constant, since this Cspec function should approach a constant value as the calculated 52 value of the frequency response function approaches the true value. However, practical measurement limitations may prevent the cross power spectrum from actually achieving a perfectly flat profile. This could occur, for instance, if the combined dynamic range of both channels is insufficient to measure the system under test, or if poor connection to the system under analysis is interfering with the measurement.

Assuming an absence of the problems that preclude a better measurement, more accurate results can be obtained in a variety of ways if the present approximation is deemed to be insufficiently accurate, i.e., step 54 exits "NO". The fastest, but least satisfactory, way to achieve improved accuracy is to repeat step 42 through 54 a number of times using the same scaled time domain version of the randomized square-root of the inverse of the estimated frequency response function according to loop 56. Averaging in this way over a number of calculations can be accomplished automatically by the 2642 Personal Fourier Analyzer.

Improved results can be obtained by expanding the number of steps that are repeated according to loop 58. Using this procedure, the same square-root inverse estimated frequency response function is used repeatedly, but the phase randomization step 36, the converting to the time domain step 38, and the scaling step 40 are repeated again for each trial. This takes more time but leads to improved results.

Maximum improvement is obtained when loop 60 is followed. This entails repeating all of the step from 32 to 54 on each pass. While this approach takes the longest time to obtain each new result, it very quickly converges on the best possible estimate of the frequency response function in a few iterations.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A method for determining the frequency response function of a system under analysis, the method comprising the steps of:
   (a) estimating the frequency response function of the system under analysis;
   (b) inverting the estimated frequency response function to obtain an inverse estimated frequency response function;
   (c) taking the square-root of the inverse estimated frequency response function to obtain a stimulus spectrum;
   (d) converting the stimulus spectrum from a frequency domain to a time domain to obtain a time domain stimulus signal;
   (e) applying the time domain stimulus signal to the system under analysis;
   (f) monitoring an output signal from the system under analysis;
   (g) converting the monitored output signal from the time domain to the frequency domain to obtain an output spectrum; and
   (h) calculating an improved estimated frequency response function from the output spectrum and the stimulus spectrum.

2. A method according to claim 1 wherein step (a) comprises the steps of:
   applying a signal having a predetermined spectrum to the system under analysis; and
   converting an output signal from the system under analysis to the frequency domain to obtain an estimated frequency response of the system under analysis.

3. A method according to claim 1 wherein step (c) comprises the steps of:
   taking the square-root of the inverse frequency response function; and
   randomizing the phase of the square-root inverse estimated frequency response function to obtain the stimulus spectrum.

4. A method according to claim 1 wherein step (d) comprises the steps of:
   converting the stimulus spectrum from a frequency domain to a time domain; and
   scaling the converted stimulus spectrum to obtain the time domain stimulus signal.

5. A method according to claim 1 further comprising, after step (e), the steps of:
   monitoring the stimulus signal to the system under analysis;
   converting the monitored stimulus signal from the time domain to the frequency domain to obtain an applied version of the stimulus spectrum; and
   using the applied version of the stimulus spectrum as the stimulus spectrum in step (h).

6. A method according to claim 1 wherein step (h) comprises the steps of:
   performing a cross spectrum calculation between the stimulus spectrum and the output spectrum to obtain a Cspec(X,Y);
   performing an auto spectrum calculation on the stimulus spectrum to obtain an Aspec(X); and
   dividing Cspec(X,Y) by Aspec(X) to obtain the improved estimate of the frequency response function $\hat{H}(f)$.

7. A method according to claim 1 further comprising the step of:
   (i) determining how closely the cross power spectrum of the stimulus spectrum and the output spectrum approximates a constant.

8. A method according to claim 7 further comprising the step of:
   (j) repeating steps (b) through (i) employing the improved estimated frequency response function from step (h) as the estimated frequency response function in step (b) until the cross power spectrum of the stimulus spectrum and the output spectrum approximates a constant to a predetermined level of accuracy.

9. A method according to claim 8 wherein step (h) comprises the steps of:
   performing a cross spectrum calculation between the stimulus spectrum and the output spectrum to obtain a Cspec(X,Y);
   performing an auto spectrum calculation on the stimulus spectrum to obtain an Aspec(X); and
   dividing Cspec(X,Y) by Aspec(X) to obtain the improved estimate of the frequency response function $\hat{H}(f)$.

10. A method according to claim 9 wherein step (a) comprises the steps of:
    applying a signal having a predetermined spectrum to the system under analysis; and
    converting an output signal from the system under analysis to the frequency domain to obtain an estimated frequency response of the system under analysis.

11. A method according to claim 10 wherein step (c) comprises the steps of:
    taking the square-root of the inverse frequency response function; and randomizing the phase of the square-root inverse estimated frequency response function to obtain the stimulus spectrum.

12. A method according to claim 11 wherein step (d) comprises the steps of:
converting the stimulus spectrum from a frequency domain to a time domain; and
scaling the converted stimulus spectrum to obtain the time domain stimulus signal.

13. A method according to claim 12 further comprising, after step (e), the steps of:
monitoring the time domain stimulus signal to the system under analysis;
converting the monitored stimulus signal from the time domain to the frequency domain to obtain an applied version of the stimulus spectrum; and
using the applied version of the stimulus spectrum as the stimulus spectrum in step (h).

14. A method according to claim 9 wherein step (c) comprises the steps of:
taking the square-root of the inverse frequency response function; and
randomizing the phase of the square-root inverse estimated frequency response function to obtain the stimulus spectrum.

15. A method according to claim 14 wherein step (d) comprises the steps of:
converting the stimulus spectrum from a frequency domain to a time domain; and
scaling the converted stimulus spectrum to obtain the time domain stimulus signal.

16. A method according to claim 15 further comprising, after step (e), the steps of:
monitoring the stimulus signal to the system under analysis;
converting the monitored stimulus signal from the time domain to the frequency domain to obtain an applied version of the stimulus spectrum; and
using the applied version of the stimulus spectrum as the stimulus spectrum in step (h).

17. A method according to claim 9 wherein step (d) comprises the steps of:
converting the stimulus spectrum from a frequency domain to a time domain; and
scaling the converted stimulus spectrum to obtain the time domain stimulus signal.

18. A method according to claim 17 further comprising, after step (e), the steps of:
monitoring the stimulus signal to the system under analysis;
converting the monitored stimulus signal from the time domain to the frequency domain to obtain an applied version of the stimulus spectrum; and
using the applied version of the stimulus spectrum as the stimulus spectrum in step (h).

19. A method according to claim 9 further comprising, after step (e), the steps of:
monitoring the stimulus signal to the system under analysis;
converting the monitored stimulus signal from the time domain to the frequency domain to obtain an applied version of the stimulus spectrum; and
using the applied version of the stimulus spectrum as the stimulus spectrum in step (h).

* * * * *